US012764945B2

(12) United States Patent
Dou et al.

(10) Patent No.: US 12,764,945 B2
(45) Date of Patent: Oct. 13, 2026

(54) SEMICONDUCTOR DEVICE AND METHOD FOR FORMING SAME

(71) Applicant: CHANGXIN MEMORY TECHNOLOGIES, INC., Hefei City (CN)

(72) Inventors: Tao Dou, Hefei City (CN); Jie Bai, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 671 days.

(21) Appl. No.: 18/154,825

(22) Filed: Jan. 14, 2023

(65) Prior Publication Data

US 2024/0008268 A1 Jan. 4, 2024

Related U.S. Application Data

(63) Continuation of application No. PCT/CN2022/110752, filed on Aug. 8, 2022.

(30) Foreign Application Priority Data

Jun. 30, 2022 (CN) ......................... 202210760577.7

(51) Int. Cl.
*H10B 12/00* (2023.01)

(52) U.S. Cl.
CPC ......... *H10B 12/50* (2023.02); *H10B 12/0335* (2023.02); *H10B 12/05* (2023.02); *H10B 12/09* (2023.02)

(58) Field of Classification Search
CPC ........ H10B 12/09; H10B 12/50; H10B 41/10; H10B 41/20; H10B 41/40;
(Continued)

(56) References Cited

U.S. PATENT DOCUMENTS 8,344,496 B1 1/2013 White
8,835,224 B2 9/2014 White
(Continued)

FOREIGN PATENT DOCUMENTS

CN 107799529 A 3/2018
CN 108231779 A 6/2018
(Continued)

OTHER PUBLICATIONS

International Search Report in the international application No. PCT/CN2022/110752, mailed on Mar. 22, 2023.

*Primary Examiner* — Yu Chen
(74) *Attorney, Agent, or Firm* — Syncoda LLC; Feng Ma

(57) ABSTRACT

A semiconductor device includes a substrate including a memory region and a peripheral region located at an outer side of the memory region; a memory structure located above the memory region and including a memory array and signal lines, the memory array at least including memory cells spaced apart from each other along a first direction, and the signal lines being electrically connected with the memory cells, the first direction is perpendicular to the top surface of the substrate; a peripheral structure located above the peripheral region and including peripheral stacked layers, peripheral circuits located above the peripheral stacked layer, and peripheral leads located above the peripheral circuits, one end of each peripheral lead being electrically connected with at least one of peripheral circuits, and the other end being electrically connected with at least one of signal lines.

20 Claims, 11 Drawing Sheets

(58) Field of Classification Search
CPC .. H10B 41/42–48; H10B 43/10; H10B 43/20; H10B 43/40; H10B 12/48; H10B 12/485
See application file for complete search history.

(56) References Cited

U.S. PATENT DOCUMENTS

| | | | | |
|---|---|---|---|---|
| 10,134,756 | B2 | 11/2018 | Shim | |
| 10,373,673 | B2 | 8/2019 | Shin | |
| 10,593,393 | B2 | 3/2020 | Shin | |
| 2013/0011965 | A1 | 1/2013 | White | |
| 2018/0068707 | A1 | 3/2018 | Shin | |
| 2018/0166461 | A1 | 6/2018 | Shim | |
| 2019/0325939 | A1 | 10/2019 | Shin et al. | |
| 2021/0057419 | A1* | 2/2021 | Shin | H10B 12/30 |

FOREIGN PATENT DOCUMENTS

| | | | |
|---|---|---|---|
| CN | 108389865 | A | 8/2018 |
| CN | 108766971 | A | 11/2018 |
| CN | 112397517 | A | 2/2021 |
| CN | 113707667 | A | 11/2021 |

* cited by examiner

SEMICONDUCTOR DEVICE AND METHOD FOR FORMING SAME

CROSS-REFERENCE TO RELATED APPLICATIONS

This is a continuation of International Application No. PCT/CN2022/110752 filed on Aug. 8, 2022, which claims priority to Chinese Patent Application No. 202210760577.7 filed on Jun. 30, 2022. The disclosures of the above-referenced applications are hereby incorporated by reference in their entirety.

BACKGROUND

Dynamic Random Access Memory (DRAM) is a semiconductor device commonly used in electronic devices such as computers, and is consisted of a plurality of memory cells, and each of the memory cells usually includes a transistor and a capacitor. The gate of the transistor is electrically connected to the word line, the source is electrically connected to the bit line, and the drain is electrically connected to the capacitor. The word line voltage applied on the word line can control the turn-on and turn-off of the transistor, so that data information stored in the capacitor can be read from or written into the capacitor through the bit line.

With the continuous development of semiconductor chips, the critical dimension of semiconductor chips is shrinking. However, due to the limitation of the structure of a lithography machine itself, there is a limit to the size reduction of a lithography pattern on semiconductor chips. Therefore, semiconductor devices such as a DRAM with three-dimensional structure came into being. However, the existing semiconductor devices still have some problems, such as large internal coupling capacitance effect, as such the yield of semiconductor devices has a space to be further improved.

Therefore, how to further reduce the coupling capacitance effect inside semiconductor devices, so as to improve the electrical properties of the semiconductor devices, is an urgent technical problem to be solved at present.

SUMMARY

The disclosure relates to the technical field of semiconductor manufacturing, and in particular to a semiconductor device and a method for forming the same.

Some embodiments of the disclosure provide a semiconductor device and a method for forming the same for reducing coupling capacitance effects inside the semiconductor device, thereby improving the electrical performance of the semiconductor device.

According to some embodiments, the disclosure provides a semiconductor device, which includes a substrate, a memory structure and a peripheral structure.

The substrate includes a memory region and a peripheral region located at an outer side of the memory region.

The memory structure is located above the memory region and includes a memory array and a plurality of signal lines, in which the memory array at least includes a plurality of memory cells spaced apart from each other along a first direction, and the signal lines are electrically connected with the memory cells, where the first direction is perpendicular to a top surface of the substrate.

The peripheral structure is located above the peripheral region and includes peripheral stacked layers, peripheral circuits located above the peripheral stacked layers, and a plurality of peripheral leads located above the peripheral circuits, in which one end of each of the peripheral leads is electrically connected with at least one of the peripheral circuits, and the other end is electrically connected with at least one of the signal lines.

According to some other embodiments, the disclosure further provides a method for forming a semiconductor device, which includes the following operations.

A substrate including a memory region and a peripheral region located at an outer side of the memory region is provided.

A memory structure is formed in the memory region and a peripheral structure is formed in the peripheral region, in which the memory structure includes a memory array and a plurality of signal lines, the memory array at least includes a plurality of memory cells spaced apart from each other along a first direction, and the signal lines are electrically connected with the memory cells, where the first direction is perpendicular to a top surface of the substrate; the peripheral structure includes peripheral stacked layers, peripheral circuits located above the peripheral stacked layers, and a plurality of peripheral leads located above the peripheral circuits, and one end of each of the peripheral leads is electrically connected with at least one of the peripheral circuits, and the other end is electrically connected with at least one of the signal lines.

DETAILED DESCRIPTION

Specific embodiments of the semiconductor device and the method for forming the same provided by the disclosure will be described in detail below with reference to the drawings.

Figure 1:
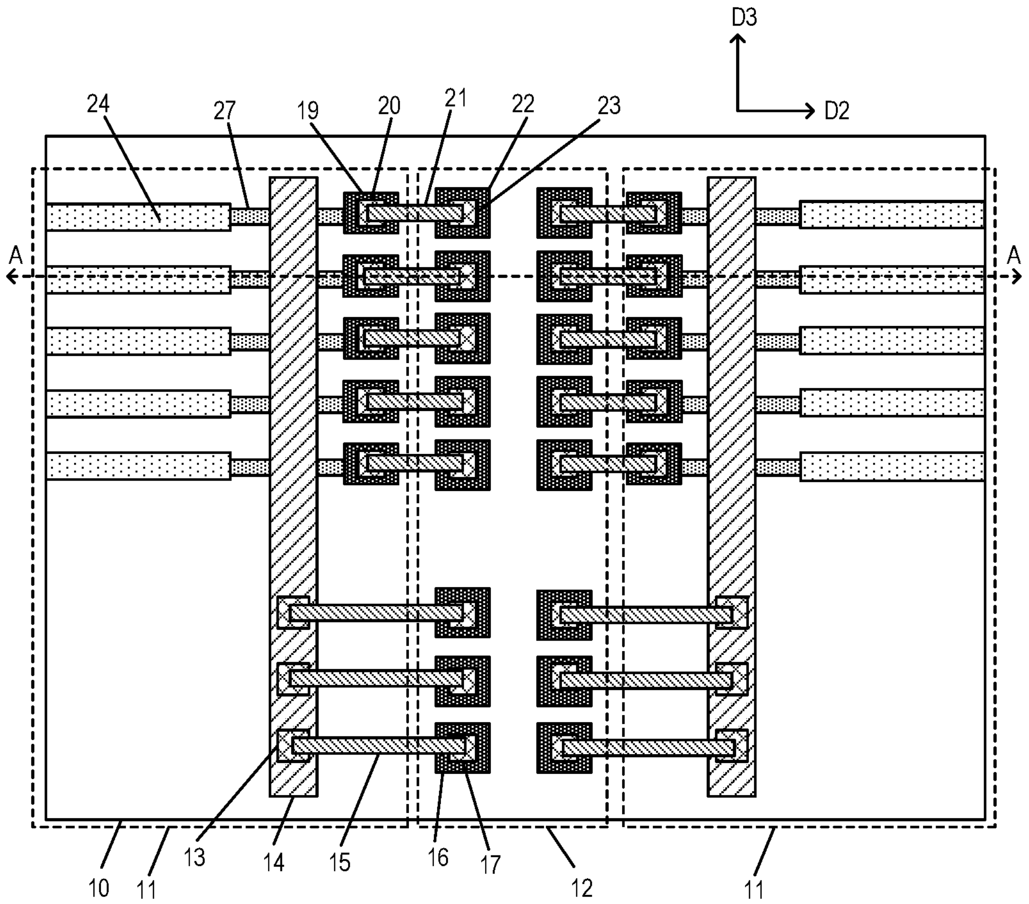
FIG. 1 is a structural top view of a semiconductor device of a specific embodiment of the disclosure.
Figure 2:
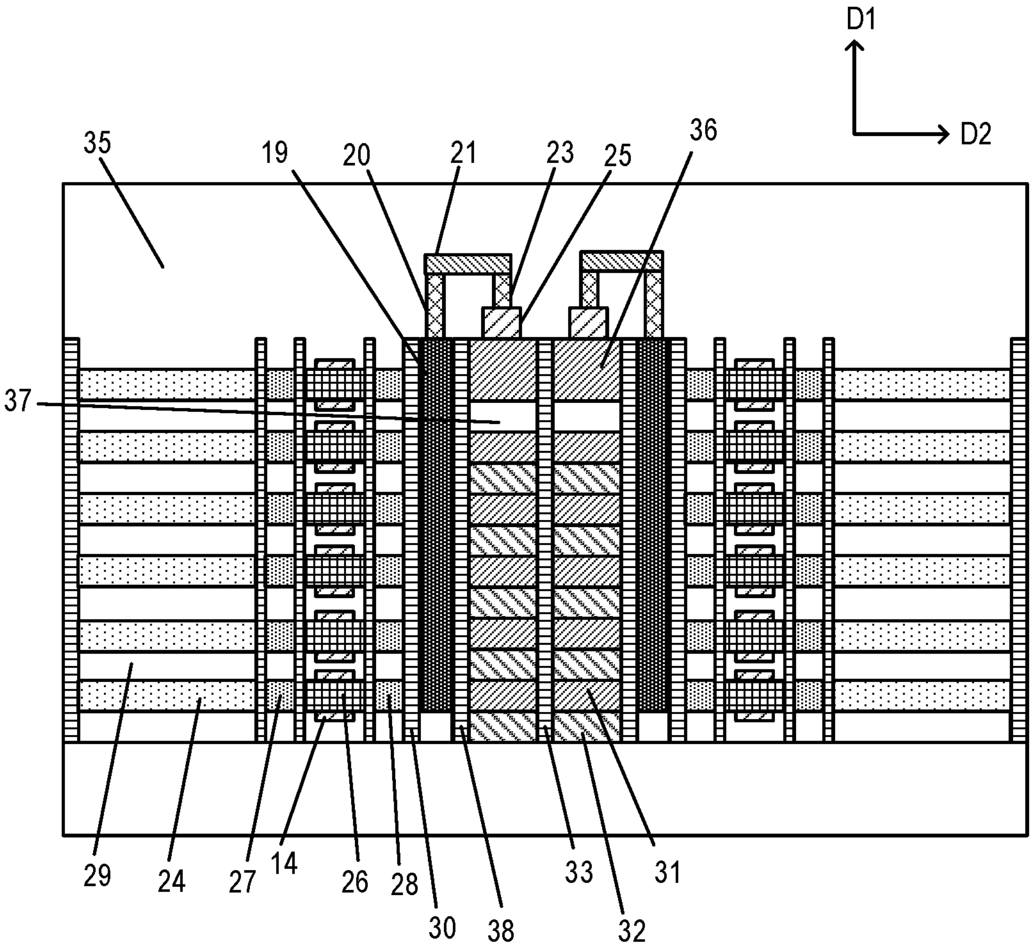
FIG. 2 is a schematic cross-sectional view of FIG. 1 at location AA.
Figure 11:
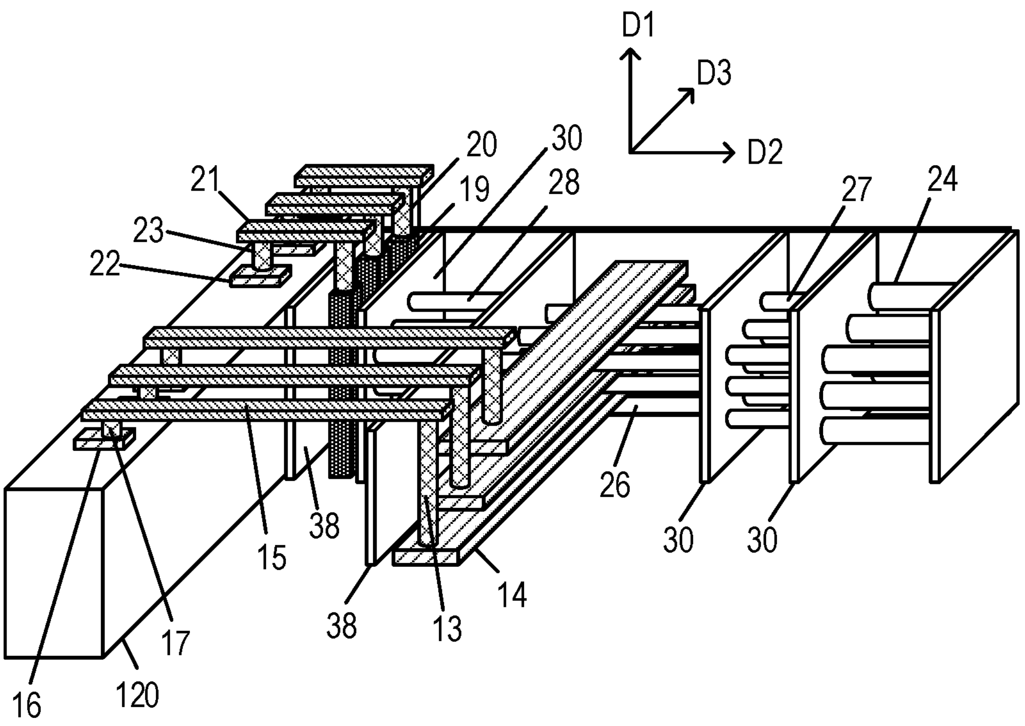
FIG. 11 is a partial three-dimensional structure diagram of a semiconductor device of a specific embodiment of the disclosure.

The specific embodiments provide a semiconductor device. FIG. 1 is a structural top view of a semiconductor device of the specific embodiment of the disclosure; FIG. 2 is a schematic cross-sectional view of FIG. 1 at location AA; and FIG. 11 is a partial three-dimensional structure diagram of a semiconductor device of a specific embodiment of the disclosure. As shown in FIGS. 1, 2 and 11, the semiconductor device includes a substrate, a memory structure and a peripheral structure.

The substrate 10 includes a memory region 11 and a peripheral region 12 located at an outer side of the memory region 11.

The memory structure is located above the memory region 11 and includes a memory array and a plurality of signal lines, in which the memory array at least includes a plurality of memory cells spaced apart from each other along a first direction D1, and the signal lines are electrically connected with the memory cells, where the first direction D1 is perpendicular to a top surface of the substrate 10.

The peripheral structure is located above the peripheral region 12 and includes peripheral stacked layers 120, peripheral circuits located above the peripheral stacked layers 120, and a plurality of peripheral leads located above the peripheral circuits. One end of each of the peripheral leads is electrically connected with one of the peripheral circuits, and the other end is electrically connected with one of the signal lines.

Specifically, the substrate 10 may be, but is not limited to a silicon substrate. The present embodiment is described by taking a silicon substrate as the substrate 10 as an example. In other embodiments, the substrate 10 may also be a semiconductor substrate such as gallium nitride, gallium arsenide, gallium carbide, silicon carbide or SOI. The substrate 10 supports device structures on its surface. In an example, the peripheral region 12 is located at an outer side of the memory region 11 along a second direction D2 parallel to the top surface of the substrate 10, as shown in FIGS. 1 and 2. In other examples, a plurality of the memory regions 11 may be arranged around the periphery of the peripheral region 12, thereby further improving the integration of the semiconductor device. The top surface of the substrate 10 refers to the surface of the substrate 10 facing the memory structure and the peripheral structure.

In an example, the top surfaces of the signal lines (e.g. the word lines 14 and/or the bit lines 19 in FIGS. 1 and 2) are electrically connected to the peripheral leads, and the bottom surfaces of the peripheral leads are electrically connected to the peripheral circuits in direct contact. The peripheral circuits in the peripheral structure are electrically connected to the signal lines in the memory structure through the peripheral leads (e.g. the first peripheral leads 17 and/or the second peripheral leads 23 in FIGS. 1 and 2), thereby transmitting external control signals to the memory cells to realize operations of the memory cells, such as reading, writing, and erasing. Herein, the peripheral circuit may be, but is not limited to, a CMOS circuit. In the specific embodiments, the peripheral circuits in the peripheral structure are arranged above the peripheral stacked layers 120, thereby reducing the height difference between the peripheral circuits and the top surfaces of the signal lines, so that the length of the peripheral leads, which are electrically connected the peripheral circuits and the signal lines, along the first direction D1 is reduced. Therefore, the facing area between the adjacent peripheral leads is reduced, and thus the coupling capacitance effect between the adjacent peripheral leads is reduced, thereby realizing the improvement of the electrical performance of the semiconductor device. In addition, in the embodiments, the peripheral circuits are formed above the peripheral stacked layers 120, so that the requirements of the peripheral structure on the substrate 10 is reduced, and the selection range of the substrate 10 is expanded, thereby contributing to further improving the performance of the semiconductor device and improving the yield of semiconductor devices.

In an embodiment, the semiconductor device further includes a third isolation layer 38 on the substrate 10. The third isolation layer 38 is located between the memory structure and the peripheral structure for isolating the memory structure and the peripheral structure. The top surface of the third isolation layer 38 is above the top surface of the memory array, and the top surface of the third isolation layer 38 is flush with or higher than the top surfaces of the signal lines. The semiconductor device also includes a dielectric layer 35 covering the memory structure, the peripheral structure and the third isolation layer 38, and the dielectric layer 35 is planarized to facilitate the formation of subsequent metal interconnect layers or other device structures.

In some embodiments, the peripheral stacked layers 120 include first semiconductor layers 31 and second semiconductor layers 32 alternately stacked along the first direction D1. The peripheral structure further includes a first isolation layer 37 located between the peripheral stacked layers 120 and the peripheral circuits.

In some embodiments, each of the peripheral circuits includes a peripheral substrate and a peripheral electrode.

The peripheral substrate 36 includes a peripheral active area, and the top surface of the peripheral substrate 36 is flush with or higher than the top surface of the memory array.

The peripheral electrode 25 is located above the peripheral active area, and one end of a peripheral lead is electrically connected with the peripheral electrode 25, and the other end is electrically connected with a signal line.

Specifically, the peripheral structure includes the peripheral stacked layers 120, the first isolation layer 37 and the peripheral circuits stacked in sequence along the first direction D1. The first isolation layer 37 is used for electrically isolating the peripheral stacked layers and the peripheral circuits. In order to simplify the manufacturing process of the semiconductor device, in an embodiment, the material of the first semiconductor layer 31 is Si, and the material of the second semiconductor layer 32 is SiGe. The material of the first isolation layer 37 may be, but is not limited to, an oxide material (e.g. silicon dioxide). The peripheral circuit includes a peripheral transistor including a peripheral active area (e.g. including a peripheral channel region, a peripheral source region, and a peripheral drain region) located in the peripheral substrate 36 and a peripheral electrode (e.g. including a peripheral gate electrode, a peripheral source electrode, and a peripheral drain electrode) located above the peripheral active area. one peripheral lead is electrically connected to the peripheral gate electrode, the peripheral source electrode or the peripheral drain electrode among the peripheral electrodes.

In order to enhance the electrical properties of the peripheral structure, in some embodiments, the peripheral substrate 36 is a fully depleted silicon-on-insulator substrate, a partly depleted silicon-on-insulator substrate, or a metal oxide semiconductor substrate. In an example, the metal oxide semiconductor substrate may be selected from $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof, in which 0<x<1, 0<y<1, 0<z<1.

In some embodiments, the signal lines extend along the first direction D1 and are electrically connected to a plurality of the memory cells, which are spaced apart from each other along the first direction D1.

The top surface of the peripheral substrate 36 is flush with the top surfaces of the signal lines.

In some embodiments, the peripheral region 12 is arranged at an outer side of the memory region 11 along a second direction D2. The memory structure further includes signal line plugs extending along the first direction D1 and electrically connected with the signal lines in contact. The peripheral leads extend along the first direction D1, and the length of the peripheral leads in the first direction D1 is less than or equal to the length of the signal line plugs in the first direction D1. The semiconductor device further includes connecting bridges.

The connecting bridges are located above the memory structure and the peripheral structure and extend in the second direction D2. One end of one of the connecting bridges is electrically connected with one signal line plug in contact and the other end is electrically connected with one peripheral lead in contact. The second direction D2 is parallel to the top surface of the substrate.

For example, the signal line plug extends along the first direction D1, and the bottom surface of the signal line plug is electrically connected in direct contact with the signal line, and the top surface of the signal line plug is electrically connected in direct contact with the connecting bridge. The peripheral lead also extend along the first direction D1, and the bottom surface of the peripheral lead is electrically connected in direct contact with the peripheral circuit, and the top surfaces of the peripheral lead is electrically connected in direct contact with the connecting bridge. The connecting bridge is above the third isolation layer 38, and the projection of the connecting bridge on the top surface of the substrate 10 extends from the memory region 11 to the peripheral region 12. Disposing the top surface of the peripheral substrate flush with the top surfaces of the signal lines extending in the first direction D1 allows the length of the peripheral leads in the first direction D1 to be less than or equal to the length of the signal line plugs in the first direction D1, so that the coupling capacitance effect between adjacent peripheral leads can be further reduced, and the peripheral leads and the signal line plugs can be simultaneously formed, thereby further simplifying the manufacturing process of the semiconductor device.

In some embodiments, the signal lines include a plurality of first signal lines spaced apart from each other along the first direction D1. In two adjacent ones of the first signal lines along the first direction D1, the length of one of the two first signal lines closer to the substrate 10 along the third direction D3 is larger than the length of the other of the two first signal lines along the third direction D3. The third direction D3 is parallel to the top surface of the substrate 10.

The peripheral circuits include a plurality of first peripheral circuits 16 spaced apart from each other along the third direction D3, and the peripheral leads include a plurality of first peripheral leads 17 spaced apart from each other along the third direction D3. One ends of the first peripheral leads 17 are electrically connected to the first peripheral circuits 16 in one-to-one correspondence, and the other ends are electrically connected to the first signal lines in one-to-one correspondence.

In some embodiments, the signal lines include a plurality of second signal lines spaced apart from each other along the third direction D3, and top surfaces of the plurality of second signal lines are flush.

The peripheral circuits include a plurality of second peripheral circuits 22 spaced apart from each other along the third direction D3, and the peripheral leads include a plurality of second peripheral leads 23 spaced apart from each other along the third direction D3. One ends of the second peripheral leads 23 are electrically connected to the second peripheral circuits 22 in one-to-one correspondence, and the other ends are electrically connected to the second signal lines in one-to-one correspondence.

In some embodiments, the first signal lines are word lines and the second signal lines are bit lines.

Alternatively, the first signal lines are bit lines and the second signal lines are word lines.

It is taken as an example for description that, the first signal lines are word lines, the second signal lines are bit lines, the connecting bridges include first connecting bridges and second connecting bridges, and the signal line plugs include first signal line plugs and second signal line plugs. As shown in FIGS. 1 and 2, the memory array includes a plurality of the memory cells arranged in an array along the first direction D1 and the third direction D3. Each of the memory cells includes a transistor and a capacitor 24 electrically connected to the transistor. The transistor includes a channel region 26, a source region 28 and a drain region 27, in which the source region 28 and the drain region 27 are respectively arranged on opposite sides of the channel region 26 along the second direction D2, and the drain region 27 is electrically connected to the capacitor 24. Interlayer isolation layers 29 are also provided between adjacent memory cells for electrically isolating any adjacent memory cells. A plurality of word lines 14 are spaced apart from each other along the first direction D1, and each of the word lines 14 extends along the third direction D3 and continuously covers a plurality of the channel regions spaced apart from each other along the third direction D3, thereby forming a horizontal word line structure. In an embodiment, a gate dielectric layer is also provided between the word line 14 and the channel region. The end of each word line 14 extending out of the memory array is for electrically connecting in contact with a corresponding first signal line plug 13. The ends of a plurality of the word lines 14 extending out of the memory array form a stepped structure so that the plurality of the word lines 14 are electrically connected in contact with the plurality of the first signal line plugs 13 in one-to-one correspondence. The stepped structure refers to, of two adjacent ones of the word lines 14 along the first direction D1, the length of one of the two word lines 14 closer to the substrate 10 along the third direction D3 is greater than the length of the other of the two word lines 14 along the third direction D3. For example, one word line 14 closer the substrate 10 along the third direction D3 has a length greater than that of another word line 14 along the third direction D3. The bottom surface of each first signal line plug 13 is electrically connected in contact with each word line 14, and the top surface of each first signal line plug is electrically connected in contact with each first connecting bridge 15. The bottom surface of each first peripheral lead 17 is electrically connected in contact with each first peripheral circuit 16, and the top surface of each first peripheral lead is electrically connected in contact with each first connecting bridge 15.

A plurality of bit lines 19 are spaced apart from each other along the third direction D3, and each of the bit lines 19 extends along the first direction D1 and is continuously connected in contact with a plurality of the source regions 28 spaced apart from each other along the first direction D1. The top surfaces of the plurality of bit lines 19 are flush, which helps to simplify not only the forming process of the bit lines, but also the forming process of the second signal line plugs 20. The bottom surface of each second signal line plug 20 is electrically connected in contact with each bit line 19, and the top surface of each second signal line plug is electrically connected in contact with each second connecting bridge 21. The bottom surface of each second peripheral lead 23 is electrically connected in contact with each second peripheral circuit 22, and the top surface of each second peripheral lead is electrically connected in contact with each second connecting bridge 21. Herein, the length of the second peripheral leads 23 and the length of the first peripheral leads 17 in the first direction D1 can be the same, so that the second peripheral leads 23 and the first peripheral leads 17 can be formed synchronously, thereby further simplifying the forming process of the semiconductor device.

The above is only an example for description and in other embodiments, the first signal lines may be bit lines and the second signal lines may be word lines.

In some embodiments, the substrate 10 includes a plurality of the memory regions 11 at outer sides of the peripheral region 12, and the memory structure is located above each of the memory regions 11.

The peripheral region 12 includes a plurality of the peripheral structures and a second isolation layer 33 located between two adjacent ones of the peripheral structures. The plurality of peripheral structures and the plurality of memory structures are electrically connected in one-to-one correspondence.

For example, the substrate 10 includes the peripheral region 12 and two memory regions 11 arranged on opposite sides of the peripheral region 12 along the second direction D2, that is, the two memory regions 11 share one peripheral region 12, thereby improving the utilization of the surface space of the substrate 10 and further improving the integration of the semiconductor device. Each of the memory regions 11 is provided with one memory structure, and the peripheral region 12 is provided with two peripheral structures that are electrically connected to the two memory structures in one-to-one correspondence, and are electrically isolated by the second isolation layer 33 in order to avoid signal crosstalk. In an embodiment, the material of the second isolation layer 33 may be a nitride material (e.g. silicon nitride).

In an embodiment, the memory structure further includes support layers 30. The support layers 30 extend along the first direction D1 and penetrate the memory array along the first direction D1 for supporting the memory array to improve the structural stability of the memory array.

Figure 3:
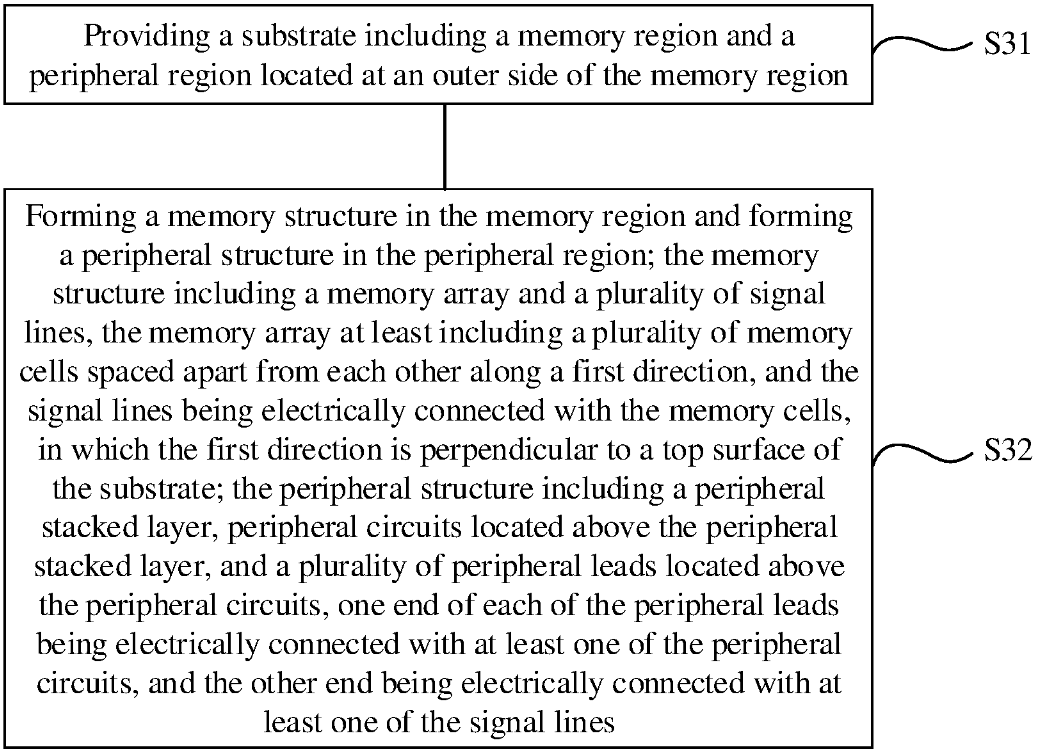
FIG. 3 is a flow chat of a method for forming a semiconductor device of a specific embodiment of the disclosure.

The specific embodiments further provide a method for forming a semiconductor device. FIG. 3 is a flow chat of a method for forming a semiconductor device of a specific embodiment of the disclosure; and FIGS. 4 to 10 are structural cross-sectional diagrams showing main processes for forming a semiconductor device in specific embodiments of the disclosure. The structure of the semiconductor device formed in the specific embodiments can be seen in FIGS. 1, 2 and 11. As shown in FIG. 1 to FIG. 11, the method for forming a semiconductor device includes the following operations.

Figure 4:
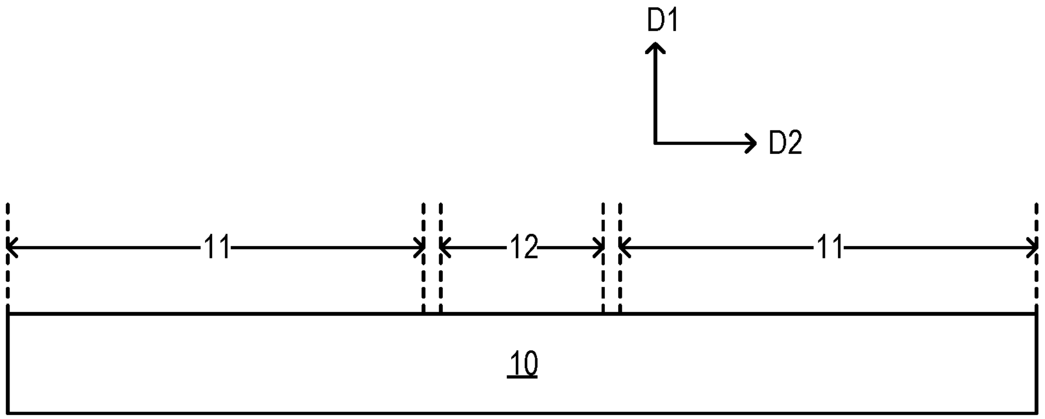
FIG. 4 is a first structural cross-sectional diagram showing main processes for forming a semiconductor device in a specific embodiment of the disclosure.
Figure 5:
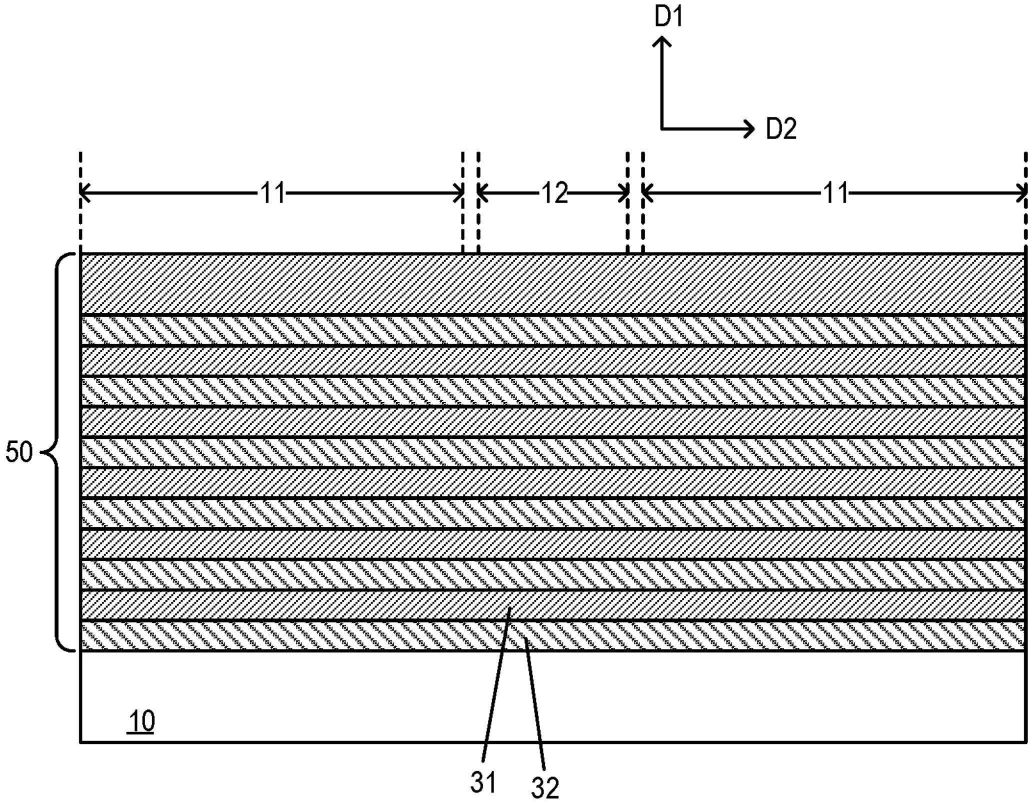
FIG. 5 is a second structural cross-sectional diagram showing main processes for forming a semiconductor device in a specific embodiment of the disclosure.

In S31, a substrate 10 including a memory region 11 and a peripheral region 12 located at an outer side of the memory region 11 is provided, as shown in FIG. 4.

Specifically, the substrate 10 may be, but is not limited to a silicon substrate and the present embodiment is described by taking a silicon substrate as the substrate 10 as an example. In other embodiments, the substrate 10 may also be a semiconductor substrate such as gallium nitride, gallium arsenide, gallium carbide, silicon carbide or SOI. In an embodiment, a plurality of the memory regions 11 and peripheral regions 12 located between two adjacent ones of the memory regions 11 may be defined on the substrate 10.

In S32, a memory structure is formed in the memory region 11 and a peripheral structure is formed in the peripheral region 12, in which the memory structure includes a memory array and a plurality of signal lines, the memory array at least includes a plurality of memory cells spaced apart from each other along a first direction D1, and the signal lines are electrically connected with the memory cells, where the first direction D1 is perpendicular to a top surface of the substrate 10; the peripheral structure includes peripheral stacked layers 120, peripheral circuits located above the peripheral stacked layers 120, and a plurality of peripheral leads located above the peripheral circuits, and one end of each of the peripheral leads is electrically connected with at least one of the peripheral circuits, and the other end is electrically connected with at least one of the signal lines.

In some embodiments, the specific operations for forming the memory structure in the memory region 11 and forming the peripheral structure in the peripheral region 12 includes the following operations.

Initial stacked layers 50 covering the memory region 11 and the peripheral region 12 are formed on a surface of the substrate 10, and the initial stacked layers 50 includes first semiconductor layers 31 and second semiconductor layers 32 alternately stacked along the first direction D1.

Figure 7:
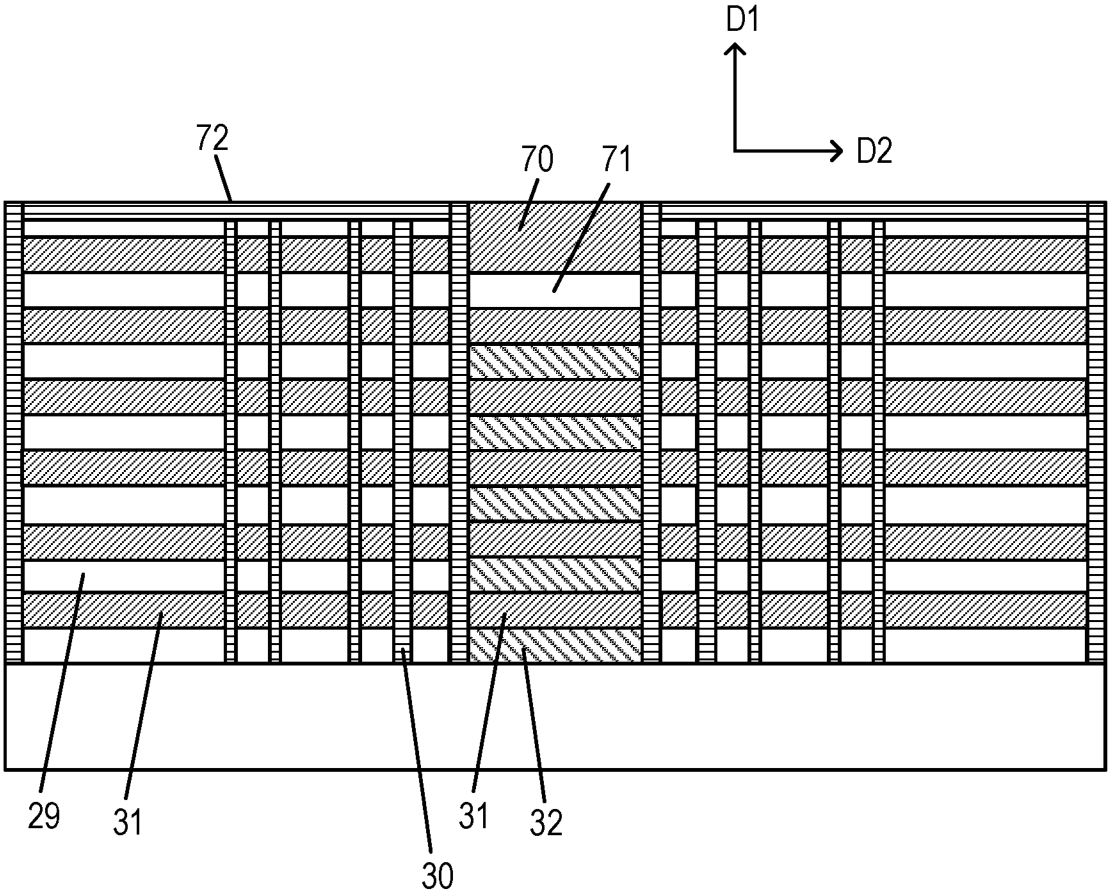
FIG. 7 is a fourth structural cross-sectional diagram showing main processes for forming a semiconductor device in a specific embodiment of the disclosure.

All the second semiconductor layers 32 in the memory region 11 are removed, and the topmost second semiconductor layer 32 in the peripheral region 12 is removed, as such, the first semiconductor layers 31 in the memory region 11 is exposed, and a first trench 71 is formed in the peripheral region 12, and the initial stacked layers 50 retained below the first trench 71 serve as the peripheral stacked layers, as shown in FIG. 7.

The memory cells and the signal lines are formed in the memory region 11, and the peripheral circuits are formed above the peripheral stacked layers in the peripheral region 12.

Figure 8:
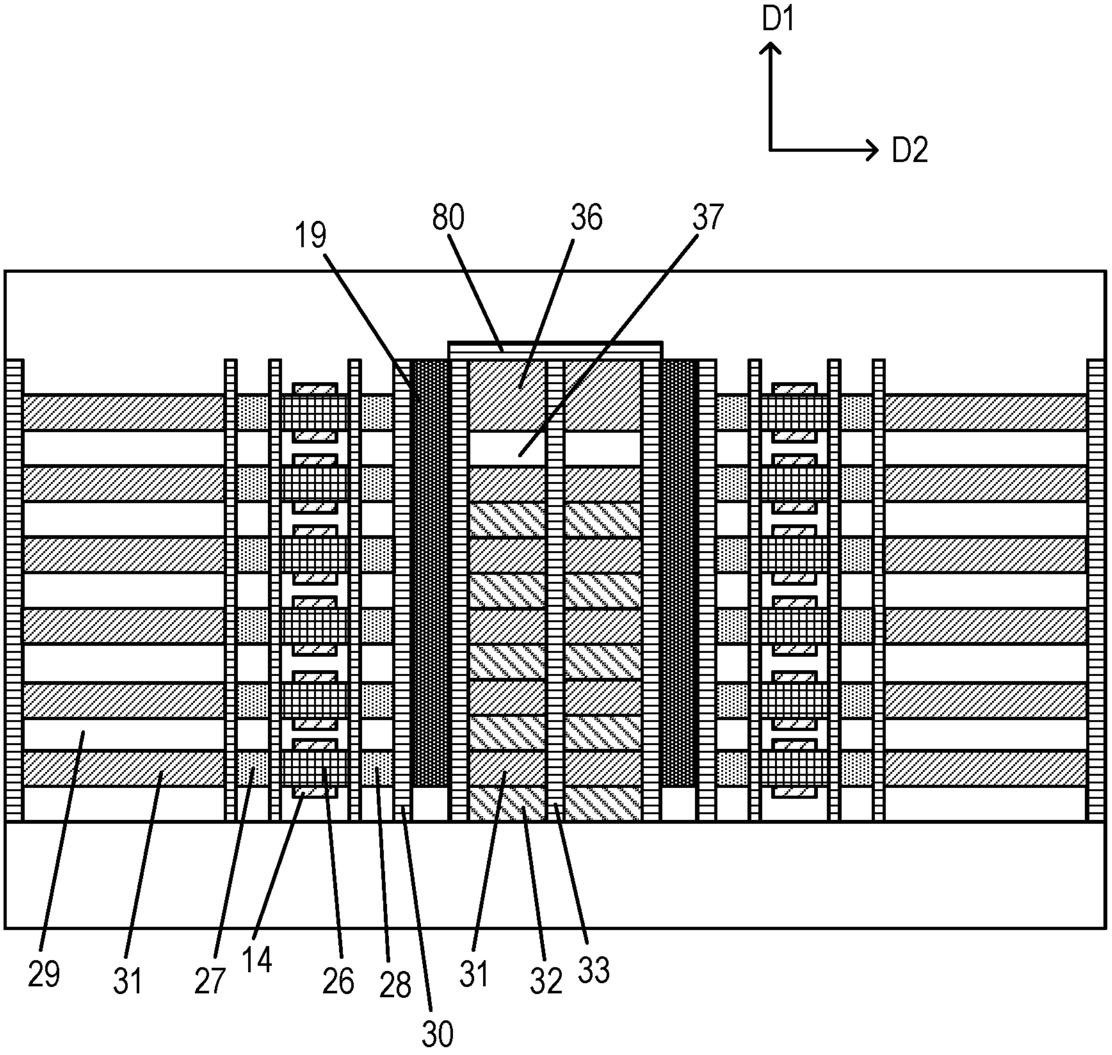
FIG. 8 is a fifth structural cross-sectional diagram showing main processes for forming a semiconductor device in a specific embodiment of the disclosure.

Interlayer isolation layers 29 are formed between the memory cells and a first isolation layer 37 is formed in the first trench as shown in FIG. 8.

The signal lines and the peripheral circuits are electrically connected.

In some embodiments, the specific operations for removing all the second semiconductor layers 32 in the memory region 11, and removing the topmost second semiconductor layer 32 in the peripheral region 12 includes the following operations.

Figure 6:
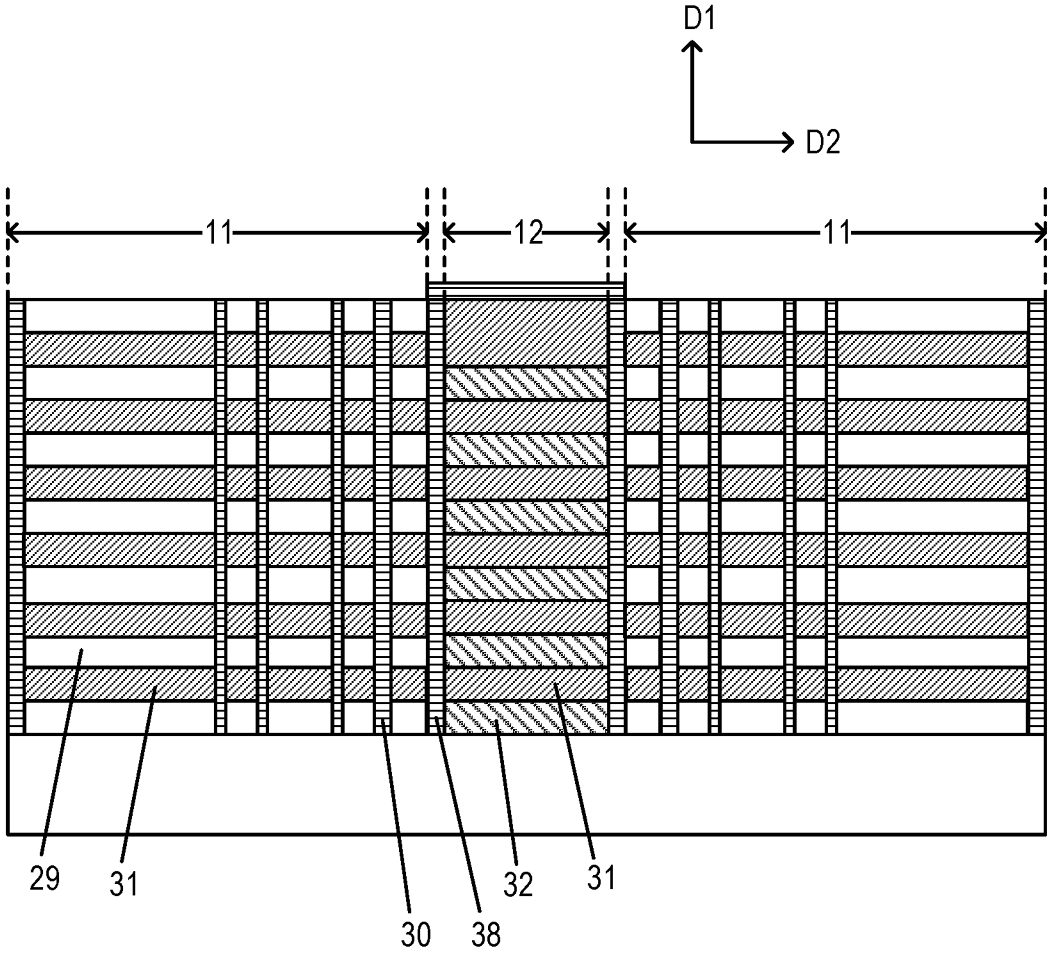
FIG. 6 is a third structural cross-sectional diagram showing main processes for forming a semiconductor device in a specific embodiment of the disclosure.

A third isolation layer 38 is formed in the initial stacked layers 50 between the memory region 11 and the peripheral region 12, and a support layer 30 is formed in the initial stacked layers 50 in the memory region 11, in which the third isolation layer 38 and the support layer 30 penetrate the initial stacked layers 50 along the first direction D1, as shown in FIG. 6.

The second semiconductor layers 32 in the initial stacked layers 50 of the memory region 11 are removed to expose the first semiconductor layers 31 in the memory region 11.

The topmost second semiconductor layer 32 of the initial stacked layers 50 is removed in the peripheral region 12 to form the first trench 71 in the peripheral region 12. The initial stacked layers 50 retained below the first trench 71 serve as the peripheral stacked layers, the first semiconductor layer 31 retained above the first trench 71 serves as the peripheral substrate 36.

In some embodiments, the substrate 10 includes a plurality of the memory regions 11 at outer sides of the peripheral region 12. The specific operations for forming the memory cells and the signal lines in the memory regions 11 and forming the peripheral circuits above the peripheral stacked layers in the peripheral region further includes the following operations.

The memory cells and the signal lines are formed in each memory region 11.

A plurality of peripheral circuits are formed above the peripheral stacked layers of the peripheral region and a second isolation layer 33 is formed between adjacent peripheral circuits.

Hereinafter, it is taken as an example for description that the substrate 10 includes a peripheral region 12 and two memory regions 11 arranged on opposite sides of the peripheral region 12 in the second direction D2. For example, the first semiconductors 31 and the second semiconductor layers 32 alternately stacked along the first direction D1 may be formed on the surface of the substrate 10 by epitaxial growth, to form the initial stacked layers 50 having a superlattice stacked structure, and the initial stacked layers 50 continuously cover the memory regions 11 and the peripheral region 12. The specific number of layers of the first semiconductor layers and the second semiconductor layers alternately stacked in the initial stacked layers 50 can be selected by those skilled in the art according to the actual requirements. The greater the number of layers of the first semiconductor layers and the second semiconductor layers alternately stacked, the greater the storage capacity of the formed semiconductor device. In an embodiment, the material of the first semiconductor layers 31 is Si, and the material of the second semiconductor layers 32 is SiGe.

Third isolation holes located between each of the memory regions 11 and the peripheral region 12 and support holes located in each of the memory regions 11 may be formed in the initial stacked layers 50 by photolithography. Next, an insulating dielectric material such as a nitride (e.g. silicon nitride) is filled in the third isolation holes and the support holes, such that the third isolation layers 38 penetrating the initial stacked layers in the first direction D1 are formed in the third isolation holes, and the support layers penetrating the initial stacked layers 50 in the first direction D1 are formed in the support holes. The third isolation layers 38 are used to isolate each of the memory regions 11 from the peripheral region 12. On one hand, the support layers 30 are used for supporting the initial stacked layers 50 to avoid tilting or collapse in the subsequent process of removing the second semiconductor layers 32. On the other hand, the support layers 30 are used for defining a transistor region, a capacitor region and a signal line region (e.g. a bit line region) in the initial stacked layers 50 in each memory region 11. Subsequently, the second semiconductor layers 32 in the initial stacked layers 50 of the memory regions 11 may be removed by wet etching, and a first gap between every two adjacent first semiconductor layers 31 is formed in each memory region 11. Next, an insulating dielectric material, such as an oxide (e.g., silicon dioxide) is deposited in the first gaps by atomic layer deposition to form the interlayer isolation layers 29, as shown in FIG. 6.

Subsequently, after forming a first barrier layer 72 covering the top surface of the initial stacked layers 50 in each memory region 11, the topmost second semiconductor layer 32 of the initial stacked layers 50 in the peripheral region 12 is removed, and thus the first trench 71 is formed in the peripheral region 12. The first trench 71 divides the initial stacked layers 50 in the peripheral region 12 into a top first semiconductor layer 70 above the first trench 71 and initial peripheral stacked layers below the first trench 71, as shown in FIG. 7. Next, an insulating dielectric material, such as an oxide (e.g. silicon dioxide) is filled in the first trench 71 to form the initial first isolation layer. The initial stacked layers 50 in the peripheral region 12 are etched to form a second isolation hole exposing the substrate 10. An insulating dielectric material, such as a nitride (e.g. silicon nitride) is filled in the second isolation hole to form a second isolation layer 33. The second isolation layer 33 divides the initial stacked layers 50 into two groups of peripheral stacked layers, divides the initial first isolation layer into two first isolation layers 37, and divides the top first semiconductor layer 70 into two peripheral substrates 36 at the same time, as shown in FIG. 8. Then, the first barrier layers 72 are removed.

In some embodiments, the peripheral region 12 is arranged at an outer side of the memory region 11 along the second direction D2 parallel to the top surface of the substrate 10. The signal lines include first signal lines. The specific operations for forming the memory cells and the signal lines in the memory region 11 and forming the peripheral circuits above the peripheral stacked layers in the peripheral region includes the following operations.

Transistors of the memory cells are formed in the memory region 11, and a plurality of the transistors are arranged in an array along the first direction D1 and a third direction D3, where the third direction D3 is parallel to the top surface of the substrate 10, and the third direction D3 intersects with the second direction D2.

A plurality of first signal lines spaced apart from each other along the first direction D1 are formed, each of the first signal lines extends along the third direction D3 and is electrically connected to a plurality the transistors spaced apart from each other along the third direction D3 in one-to-one correspondence, and in two adjacent ones of the first signal lines along the first direction D1, one of the two first signal lines closer to the substrate 10 along the third direction D3 has a length larger than that of the other of the two first signal lines along the third direction, where the third direction D3 is parallel to the top surface of the substrate 10.

A plurality of first peripheral circuits 16 spaced apart from each other along the third direction D3 are formed in the peripheral substrate 36.

In some embodiments, the signal lines further include second signal lines. The specific operations for forming the memory cells and the signal lines in the memory region 11 and forming the peripheral circuits above the peripheral stacked layers in the peripheral region 12 further includes the following operations.

A plurality of the second signal lines spaced apart from each other along the third direction D3 are formed, in which the second signal lines extend along the first direction D1 and are electrically connected to a plurality of the transistors spaced apart from each other along the first direction D1 in one-to-one correspondence.

A plurality of second peripheral circuits 22 spaced apart from each other along the third direction D3 are formed in the peripheral substrate 36.

In some embodiments, the specific operation for forming a plurality of the second signal lines spaced apart from each other along the third direction d3 includes the following operation.

A plurality of the second signal lines spaced apart from each other along the third direction D3 are formed, in which top surfaces of the second signal lines are flush with a top surface of the peripheral substrate 36.

In some embodiments, the first signal lines are word lines and the second signal lines are bit lines.

Alternatively, the first signal lines are bit lines and the second signal lines are word lines.

Hereinafter, it is taken as an example for description that the first signal lines are bit lines and the second signal lines are word lines. For example, a second barrier layer 80 covering the peripheral substrate 36 is formed, and then doping ions are implanted into the first semiconductor layers 31 of the transistor region to form a plurality of the transistors which are arranged in an array along the first direction D1 and the third direction D3. Each of the transistors includes a memory channel region 26, and a memory source region 28 and a memory drain region 27 arranged on opposite sides of the memory channel region 26 along the second direction D2. Thereafter, a word line material (for example, a conductive material such as tungsten or TiN) is deposited on the transistor region to form a plurality of word lines 14 spaced apart from each other along the first direction D1. Each word lines 14 extends along the third direction D3 and continuously covers a plurality of the memory channel regions 26 that are spaced apart from each other along the third direction D3. The end of each word line 14 extends out of the memory array. Ends of the plurality of the word lines 14 extending out of the memory array are etched to form a stepped structure. The stepped structure refers to, in two adjacent ones of the word lines 14 along the first direction D1, the length of one of the two word lines 14 closer to the substrate 10 along the third direction D3 is greater than the length of the other of the two word lines 14 along the third direction D3. Next, the first semiconductor layers 31 remaining in the bit line region are removed to form bit line through holes exposing the substrate 10. A conductive material such as tungsten is filled in the bit line through holes to form the bit lines 19, as shown in FIG. 8. The plurality of bit lines 19 are spaced apart from each other along the third direction D3, and each of the bit lines 19 is continuously connected in contact with the plurality of the memory source regions 28 spaced apart from each other along the first direction D1.

Figure 9:
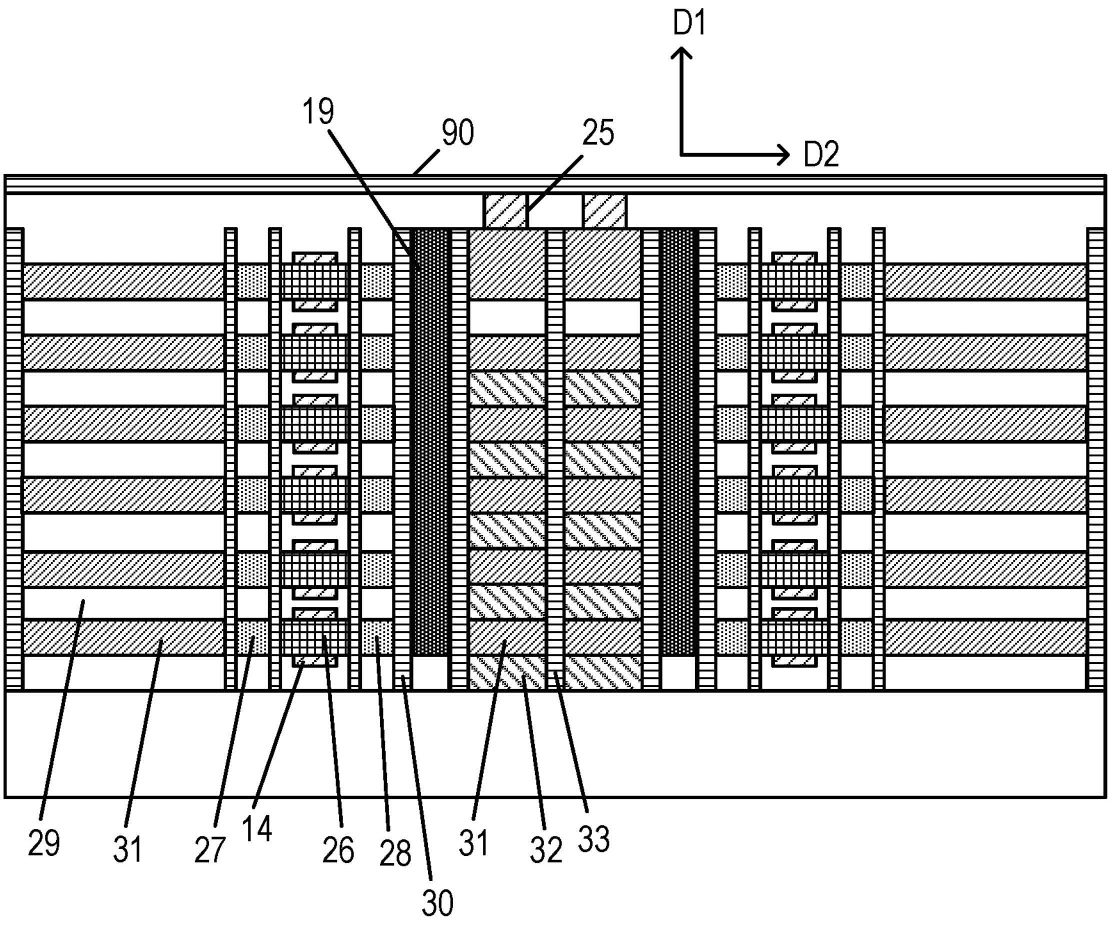
FIG. 9 is a sixth structural cross-sectional diagram showing main processes for forming a semiconductor device in a specific embodiment of the disclosure.

After the transistors, the bit lines 19, and the word lines 14 are formed, the second barrier layer 80 is removed, and the peripheral substrate 36 is treated, such as doped or the like, and elements such as peripheral electrodes 25 are formed on the peripheral substrate 36, to form the first peripheral circuits 16 and the second peripheral circuits 22, as shown in FIGS. 1 and 9.

In some embodiments, before connecting the signal lines and the peripheral circuits electrically, the following operation is further included.

Capacitors 24 of the memory cells are formed in the memory region 11, and the capacitors are electrically connected with the transistors.

Figure 10:
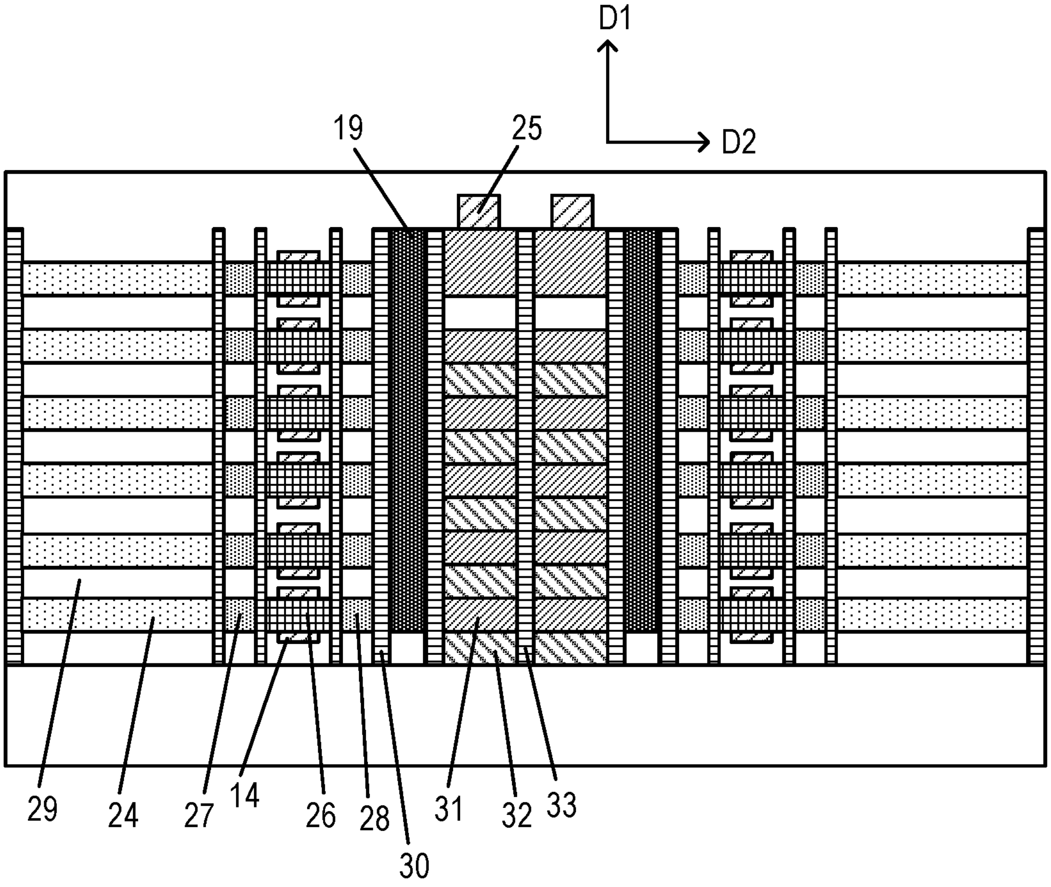
FIG. 10 is a seventh structural cross-sectional diagram showing main processes for forming a semiconductor device in a specific embodiment of the disclosure.

Specifically, after the peripheral circuits are formed, a third barrier layer 90 is formed, covering the top surfaces of the peripheral circuits and the top surface of the formed memory structure, as shown in FIG. 9. Thereafter, a capacitor 24 connected with the memory drain region 27 of each transistor is formed in the memory region 11. After the third barrier layer 90 is removed, a structure as shown in FIG. 10 is obtained. In the specific embodiments, the capacitors 24 are formed after the peripheral circuits are formed, so that damage to the capacitors 24 caused by the forming process of the peripheral circuits is avoided.

In some embodiments, the specific operations for connecting the signal lines and the peripheral circuits electrically include the following operations.

First signal line plugs 13 electrically connected to the first signal lines, first peripheral leads 17 electrically connected to the first peripheral circuits 16, second signal line plugs electrically connected to the second signal lines, and second peripheral leads 23 electrically connected to the second peripheral circuits 22 are formed at the same time.

First connecting bridges 15 for electrically connecting the first signal line plugs 13 and the first peripheral leads 17 are formed, and second connecting bridges 21 for electrically connecting the second signal line plugs 20 and the second peripheral leads 23 are simultaneously formed, as shown in FIGS. 1, 2 and 11.

Specifically, the first signal line plugs 13, the first peripheral leads 17, the second signal line plugs 20, and the second peripheral leads 23 can be formed synchronously by etching and filling processes. Herein, the materials of the first signal line plugs 13, the first peripheral leads 17, the second signal line plugs 20, and the second peripheral leads 23 may all be tungsten. The materials of the first connecting bridges 15 and the second connecting bridges 21 may both be copper.

Some embodiments of the specific embodiments provide a semiconductor device and a method for forming the same, in which the peripheral circuit is arranged above the peripheral stacked layers, so that the length of the peripheral leads can be reduced, thereby reducing the facing area between the adjacent peripheral leads, and eventually achieving the effect of reducing the coupling capacitance effect between the adjacent peripheral leads, so as to improve the electrical performance of the semiconductor device. In addition, due to the reduction of the length of the peripheral leads, the raw material for forming the semiconductor device can be saved, thereby reducing the manufacturing cost of the semiconductor device. Furthermore, in some embodiments of the specific embodiments, the peripheral stacked layers can be formed simultaneously with the stacked layers used for forming the memory array in the memory region without additional processes for forming an additional peripheral stacked layer, thereby contributing to simplifying the process of manufacturing the semiconductor device and reducing the manufacturing cost of the semiconductor device.

The descriptions above are only some preferred embodiments of the present disclosure, and it should be noted that several improvements and modifications may be made to one of ordinary skill in the art without departing from the principles of the present disclosure, and such improvements and modifications are also to be considered as the scope of protection of the present disclosure.

What is claimed is:

1. A semiconductor device, comprising:

a substrate comprising a memory region and a peripheral region located at an outer side of the memory region;

a memory structure located above the memory region and comprising a memory array and a plurality of signal lines, the memory array comprising memory cells spaced apart from each other, and the signal lines being electrically connected with the memory cells, wherein the signal lines comprises first signal lines and second signal lines, the first signal lines extend along a first direction and the second signal lines extend along a second direction intersecting the first direction, the memory structure further comprises signal line plugs, the signal line plugs comprise first signal line plugs electrically connected to the first signal lines and second signal line plugs electrically connected to the second signal lines; and a peripheral structure located above the peripheral region and comprising peripheral stacked layers, peripheral circuits located above the peripheral stacked layers, and a plurality of peripheral leads located above the peripheral circuits, one end of each of the peripheral leads being electrically connected with at least one of the peripheral circuits, and the other end being electrically connected with at least one of the signal lines, wherein the peripheral circuits comprise first peripheral circuits and second peripheral circuits, the peripheral leads comprise first peripheral leads and second peripheral leads, the first peripheral leads are electrically connected to the first peripheral circuits, the second peripheral leads are electrically connected to the second peripheral circuits;

first connecting bridges electrically connecting the first signal line plugs and the first peripheral leads, and second connecting bridges electrically connecting the second signal line plugs and the second peripheral leads, wherein the second connecting bridges extend from the second signal lines to the second peripheral circuits along a third direction, the first connecting bridges extend from the first signal lines to the first peripheral circuits along the third direction, and the third direction intersecting the first direction and the second direction and is parallel to a top surface, on which the memory structure and the peripheral structure are formed, of the substrate.

2. The semiconductor device of claim 1, wherein the peripheral stacked layers comprise first semiconductor layers and second semiconductor layers alternately stacked along the first direction; and the peripheral structure further comprises:

a first isolation layer located between the peripheral stacked layers and the peripheral circuits.

3. The semiconductor structure of claim 2, wherein each of the peripheral circuits comprises:

a peripheral substrate comprising a peripheral active area, a top surface of the peripheral substrate being flush with or higher than a top surface of the memory array; and a peripheral electrode located on the peripheral active area, the one end of each of the peripheral leads being electrically connected with the peripheral electrode, and the other end being electrically connected with the at least one of the signal lines.

4. The semiconductor device of claim 3, wherein the peripheral substrate is a fully depleted silicon-on-insulator substrate, a partly depleted silicon-on-insulator substrate, or a metal oxide semiconductor substrate.

5. The semiconductor device of claim 3, wherein the first signal lines extend along the first direction, each of the first signal lines is electrically connected to a plurality of the memory cells spaced apart from each other along the first direction, the first direction is perpendicular to the top surface of the substrate; and the top surface of the peripheral substrate is flush with top surfaces of the first signal lines.

6. The semiconductor device of claim 1, wherein the signal line plugs extend along the first direction, the peripheral leads extend along the first direction, and a length of the peripheral leads in the first direction is less than or equal to a length of the signal line plugs in the first direction;

the peripheral region is arranged at the outer side of the memory region along the third direction, wherein the first direction is perpendicular to the top surface of the substrate, and the third direction is parallel to the top surface of the substrate.

7. The semiconductor device of claim 1, wherein the first signal lines are spaced apart from each other along the first direction, the peripheral region is arranged at the outer side of the memory region along the third direction, the first direction is perpendicular to the top surface of the substrate, and the third direction is parallel to the top surface of the substrate, wherein in two adjacent ones of the first signal lines along the first direction, one of the two first signal lines closer to the substrate has a length along the second direction larger than a length of the other of the two first signal lines along the second direction, and the second direction is parallel to the top surface of the substrate and intersects with the third direction; and wherein the first peripheral circuits are spaced apart from each other along the second direction, and the first peripheral leads are spaced apart from each other along the second direction; one ends of the first peripheral leads are electrically connected to the first peripheral circuits in one-to-one correspondence, and the other ends are electrically connected to the first signal lines in one-to-one correspondence.

8. The semiconductor device of claim 7, wherein the second signal lines are spaced apart from each other along the second direction, and top surfaces of the plurality of second signal lines are flush; and wherein the second peripheral circuits are spaced apart from each other along the second direction, and the second peripheral leads are spaced apart from each other along the second direction; one ends of the second peripheral leads are electrically connected to the second peripheral circuits in one-to-one correspondence, and the other ends are electrically connected to the second signal lines in one-to-one correspondence.

9. The semiconductor device of claim 8, wherein the first signal lines are word lines, the second signal lines are bit lines.

10. The semiconductor device of claim 1, wherein the substrate comprises a plurality of the memory regions at outer sides of the peripheral region, and a respective one of the memory structures is located above each of the memory regions;

the peripheral region comprises a plurality of the peripheral structures and an isolation layer located between two adjacent ones of the peripheral structures, the plurality of the peripheral structures and the plurality of the memory structures being electrically connected in one-to-one correspondence.

11. A method for forming a semiconductor device, comprising:

providing a substrate comprising a memory region and a peripheral region located at an outer side of the memory region; and forming a memory structure in the memory region and forming a peripheral structure in the peripheral region;

the memory structure comprising a memory array and a plurality of signal lines, the memory array comprising memory cells spaced apart from each other, and the signal lines being electrically connected with the memory cells, wherein the signal lines comprises first signal lines and second signal lines, the first signal lines extends along a first direction and the second signal lines extend along a second direction intersecting the first direction, the memory structure further comprises signal line plugs, the signal line plugs comprise first signal line plugs electrically connected to the first signal lines and second signal line plugs electrically connected to the second signal lines;

the peripheral structure comprising peripheral stacked layers, peripheral circuits located above the peripheral stacked layers, and a plurality of peripheral leads located above the peripheral circuits, one end of each of the peripheral leads being electrically connected with at least one of the peripheral circuits, and the other end being electrically connected with at least one of the signal lines, wherein the peripheral circuits comprise first peripheral circuits and second peripheral circuits, the peripheral leads comprise first peripheral leads and second peripheral leads, the first peripheral leads are electrically connected to the first peripheral circuits, the second peripheral leads are electrically connected to the second peripheral circuits;

forming first connecting bridges electrically connecting the first signal line plugs and the first peripheral leads, and second connecting bridges electrically connecting the second signal line plugs and the second peripheral leads, wherein the second connecting bridges extend from the second signal lines to the second peripheral circuits along a third direction, the first connecting bridges extend from the first signal lines to the first peripheral circuits along the third direction, and the third direction intersecting the first direction and the second direction and is parallel to a top surface, on which the memory structure and the peripheral structure are formed, of the substrate.

12. The method of claim 11, wherein forming the memory structure in the memory region and forming the peripheral structure in the peripheral region comprises:

forming initial stacked layers covering the memory region and the peripheral region on the top surface of the substrate, the initial stacked layers comprising first semiconductor layers and second semiconductor layers alternately stacked along the first direction, wherein the first direction is perpendicular to the top surface of the substrate;

removing all the second semiconductor layers in the memory region, and removing the topmost second semiconductor layer in the peripheral region, exposing the first semiconductor layers in the memory region, and forming a first trench in the peripheral region, and the initial stacked layers retained below the first trench serving as the peripheral stacked layers;

forming the memory cells and the signal lines in the memory region, and forming the peripheral circuits above the peripheral stacked layers in the peripheral region;

forming interlayer isolation layers between the memory cells and forming a first isolation layer in the first trench; and connecting the signal lines and the peripheral circuits electrically.

13. The method of claim 12, wherein removing all the second semiconductor layers in the memory region, and removing the topmost second semiconductor layer in the peripheral region comprises:

forming a second isolation layer in the initial stacked layers between the memory region and the peripheral region, and forming a support layer in the initial stacked layers in the memory region, the second isolation layer and the support layer penetrating the initial stacked layers along the first direction;

removing the second semiconductor layers in the initial stacked layers of the memory region to expose the first semiconductor layers in the memory region; and removing the topmost second semiconductor layer of the initial stacked layers in the peripheral region to forming the first trench in the peripheral region, and the initial stacked layers retained below the first trench serving as the peripheral stacked layers, the first semiconductor layer retained above the first trench serving as a peripheral substrate.

14. The method of claim 13, wherein the peripheral region is arranged at the outer side of the memory region along the third direction which is parallel to the top surface of the substrate; and wherein forming the memory cells and the signal lines in the memory region and forming the peripheral circuits above the peripheral stacked layers in the peripheral region comprises:

forming transistors of the memory cells in the memory region, the transistors being arranged in an array along the first direction and the second direction, the second direction being parallel to the top surface of the substrate, and the second direction intersecting with the third direction;

forming the first signal lines spaced apart from each other along the first direction, the first signal lines extending along the second direction and being electrically connected to a plurality of the transistors spaced apart from each other along the second direction in one-to-one correspondence, and in two adjacent ones of the first signal lines along the first direction, one of the two first signal lines closer to the substrate has a length along the second direction larger than a length of the other of the two first signal lines along the second direction; and forming the first peripheral circuits spaced apart from each other along the second direction in the peripheral substrate.

15. The method of claim 14, wherein forming the memory cells and the signal lines in the memory region and forming the peripheral circuits above the peripheral stacked layers in the peripheral region further comprises:

forming the second signal lines spaced apart from each other along the second direction, the second signal lines extending along the first direction and being electrically connected to a plurality of the transistors spaced apart from each other along the first direction in one-to-one correspondence; and forming the second peripheral circuits spaced apart from each other along the second direction in the peripheral substrate.

16. The method of claim 15, wherein top surfaces of the second signal lines are flush with a top surface of the peripheral substrate.

17. The method of claim 15, wherein electrically connecting the signal lines and the peripheral circuits comprises:

simultaneously forming the first signal line plugs electrically connected to the first signal lines, the first peripheral leads electrically connected to the first peripheral circuits, the second signal line plugs electrically connected to the second signal lines, and the second peripheral leads electrically connected to the second peripheral circuits; and forming the first connecting bridges for electrically connecting the first signal line plugs and the first peripheral leads, and simultaneously forming the second connecting bridges for electrically connecting the second signal line plugs and the second peripheral leads.

18. The method of claim 14, wherein before electrically connecting the signal lines and the peripheral circuits, the method further comprises:

forming capacitors of the memory cells in the memory region, the capacitors being electrically connected with the transistors.

19. The method of claim 15, wherein the first signal lines are word lines, the second signal lines are bit lines.

20. The method of claim 12, wherein the substrate comprises a plurality of the memory regions at outer sides of the peripheral region, and a respective one of the memory structures is located above each of the memory regions;

the peripheral region comprises a plurality of the peripheral structures and an isolation layer located between two adjacent ones of the peripheral structures, the plurality of the peripheral structures and the plurality of the memory structures being electrically connected in one-to-one correspondence.

* * * * *